United States Patent
Gassilloud et al.

(10) Patent No.: US 11,329,224 B2
(45) Date of Patent: May 10, 2022

(54) OXRAM OXIDE BASED RESISTIVE RANDOM ACCESS MEMORY CELL AND ASSOCIATED MANUFACTURING METHOD

(71) Applicant: COMMISSARIAT À L'ÉNERGIE ATOMIQUE ET AUX ÉNERGIES ALTERNATIVES, Paris (FR)

(72) Inventors: Rémy Gassilloud, Grenoble (FR); Mathieu Bernard, Grenoble (FR); Christelle Charpin-Nicolle, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 160 days.

(21) Appl. No.: 16/712,145

(22) Filed: Dec. 12, 2019

(65) Prior Publication Data
US 2020/0194671 A1    Jun. 18, 2020

(30) Foreign Application Priority Data
Dec. 14, 2018  (FR) .................................. 1872909

(51) Int. Cl.
*H01L 45/00*      (2006.01)
(52) U.S. Cl.
CPC ........ *H01L 45/147* (2013.01); *H01L 45/1253* (2013.01); *H01L 45/1608* (2013.01)
(58) Field of Classification Search
CPC ............. H01L 45/1233; H01L 45/1253; H01L 45/146; H01L 45/1641
See application file for complete search history.

(56) References Cited

U.S. PATENT DOCUMENTS

2013/0126821 A1   5/2013  Sekar et al.
2020/0194671 A1*  6/2020  Gassilloud .......... H01L 45/1233

OTHER PUBLICATIONS

Search Report as issued in French Patent Application No. 1872909, dated Sep. 24, 2019.
(Continued)

*Primary Examiner* — Mark V Prenty
(74) *Attorney, Agent, or Firm* — Pillsbury Winthrop Shaw Pittman LLP

(57) ABSTRACT

An OxRAM oxide based resistive random access memory cell includes a first electrode; a layer M1Oss of a sub-stoichiometric oxide of a first metal; a layer M2N of a nitride of a second metal M2; a layer M3M4O of a ternary alloy of a third metal M3, a fourth metal M4 and oxygen O, or M3M4NO of a quaternary alloy of the third metal M3, the fourth metal M4, nitrogen N and oxygen O and a second electrode. The standard free enthalpy of formation of the ternary alloy M3M4O, noted $\Delta G_{f,T}^{0}$ (M3M4O), or of the quaternary alloy M3M4NO, noted $\Delta G_{f,T}^{0}$ (M3M4NO), is strictly less than the standard free enthalpy of formation of the sub-stoichiometric oxide M1Oss of the first metal M1, noted $\Delta G_{f,T}^{0}$ (M1Oss), itself less than or equal to the standard free enthalpy of formation of any ternary oxynitride M2NO of the second metal M2, noted $\Delta G_{f,T}^{0}$ (M2NO):

$$\Delta G_{f,T}^{0}(M3M4O) < \Delta G_{f,T}^{0}(M1Oss) \leq \Delta G_{f,T}^{0}(M2NO)$$

or $\Delta G_{f,T}^{0}(M3M4NO) < \Delta G_{f,T}^{0}(M1Oss) \leq \Delta G_{f,T}^{0}$ (M2NO).

19 Claims, 5 Drawing Sheets

(56) References Cited

OTHER PUBLICATIONS

Woo, J., et al., "8-inch Wafer-scale $HfO_x$-based RRAM for 1S-1R Cross-point Memory Applications," 2014 14$^{th}$ Annual Non-Volatile Memory Technology Symposium (NVMTS), Oct. 2014, XP032747411, pp. 1-4.

\* cited by examiner

OXRAM OXIDE BASED RESISTIVE RANDOM ACCESS MEMORY CELL AND ASSOCIATED MANUFACTURING METHOD

CROSS REFERENCE TO RELATED APPLICATIONS

This application claims priority to French Patent Application No. 1872909, filed Dec. 14, 2018, the entire content of which is incorporated herein by reference in its entirety.

FIELD

The present invention relates to an OxRAM oxide based resistive random access memory cell and a method for manufacturing such a cell.

BACKGROUND

Generally speaking, an OxRAM cell is formed of a stack of a first metal layer, an insulator layer and a second metal layer, noted metal-insulator-metal or "MIM". In a standard manner, the first metal layer is a lower electrode made of titanium nitride TiN, on which is deposited the insulator layer made of hafnium dioxide $HfO_2$, typically of 10 nm thickness, and the second metal layer comprises a layer of titanium Ti, typically of 10 nm thickness, deposited on the insulator layer, and an upper electrode made of titanium nitride TiN deposited on the layer of titanium Ti.

In such a structure, thermodynamic equilibrium is achieved by migration of a part of the oxygen contained in the insulator layer made of hafnium dioxide $HfO_2$ to the layer of titanium Ti situated just above, the oxygen being in so-called "α-Ti" metal titanium interstitial position, such that the stoichiometric hafnium dioxide $HfO_2$ becomes sub-stoichiometric hafnium dioxide $HfO_{z<2}$. The fact that sub-stoichiometric hafnium dioxide $HfO_{z<2}$ has oxygen vacancies compared to stoichiometric hafnium dioxide $HfO_2$ enables to facilitate the formation of a filament within the OxRAM cell, and notably the first formation of a filament during the forming step.

It is desirable to be able to control the oxygen vacancy content of the insulator, but it is not possible to deposit directly a layer of sub-stoichiometric hafnium dioxide $HfO_{z<2}$ with a controlled oxygen vacancy content. Indeed, when it is sought to introduce oxygen into a layer of hafnium, the first stable compound that is obtained is directly hafnium dioxide $HfO_2$. To control the oxygen vacancy content of the insulator, it is thus known to work on a stack of a layer of hafnium Hf on a layer of stoichiometric hafnium dioxide $HfO_2$. Thermodynamic equilibrium is achieved in the same way as previously, by migration of a part of the oxygen contained in the insulator layer made of hafnium dioxide $HfO_2$ to the layer of hafnium Hf situated just above, the oxygen being in so-called "α-Hf" metal hafnium interstitial position, such that stoichiometric hafnium dioxide $HfO_2$ becomes sub-stoichiometric hafnium dioxide $HfO_{z<2}$. A constraint, with this stack, is that the upper layer of hafnium Hf must not be exposed to air at the risk of immediate oxidation of hafnium Hf into hafnium dioxide $HfO_2$. It is thus necessary to protect the upper layer of hafnium Hf by covering it in situ, under controlled atmosphere, by the upper electrode. This requires however specific, thus expensive, equipment.

To be free of this constraint, it would be desirable to be able to work on a stack of a layer of hafnium dioxide $HfO_2$ on a layer of hafnium Hf, but this is not possible because the deposition of hafnium dioxide $HfO_2$ is carried out in an oxidising atmosphere, which immediately transforms hafnium Hf into hafnium dioxide $HfO_2$. More generally, it would be desirable to obtain an insulator having an oxygen gradient in its thickness with a localised oxygen depletion on the side of the lower electrode, because this would favour the localisation of oxygen diffusion phenomena at a distance from a potential surface oxidation.

SUMMARY

It is observed that there exists a need to control, in an OxRAM structure comprising an insulator based on transition metal oxide, the oxygen vacancy content of the insulator, or in other words the residual quantity of oxygen of the insulator, in a more economical manner than in the prior art. It is also observed that there exists a need to favour the localisation of oxygen diffusion phenomena, in an OxRAM cell comprising an insulator based on transition metal oxide, on the side of the lower electrode, at a distance from a potential surface oxidation.

According to a first aspect of the invention, this need is satisfied by proposing an OxRAM oxide based resistive random access memory cell comprising an insulator layer arranged between a first metal layer and a second metal layer, in which:

the first metal layer is a first electrode;
the insulator layer is a layer M1Oss of a sub-stoichiometric oxide of a first metal M1;
the second metal layer comprises, in this order from the insulator layer:
a first sub-layer M2N of a nitride of a second metal M2;
a second sub-layer M3M4O of a ternary alloy of a third metal M3, a fourth metal M4 and oxygen O, or M3M4NO of a quaternary alloy of the third metal M3, the fourth metal M4, nitrogen N and oxygen O;
a second electrode;

the first, second, third and fourth metals M1, M2, M3 and M4 being selected in such a way that the standard free enthalpy of formation of the ternary alloy M3M4O, noted $\Delta G_{f,T}^0(M3M4O)$, or of the quaternary alloy M3M4NO, noted $\Delta G_{f,T}^0(M3M4NO)$, is strictly less than the standard free enthalpy of formation of the sub-stoichiometric oxide M1Oss of the first metal M1, noted $\Delta G_{f,T}^0(M1Oss)$, itself less than or equal to the standard free enthalpy of formation of any ternary oxynitride M2NO of the second metal M2, noted $\Delta G_{f,T}^0(M2NO)$:

$$\Delta G_{f,T}^0(M3M4O) < \Delta G_{f,T}^0(M1Oss) \leq \Delta G_{f,T}^0(M2NO)$$

or $\Delta G_{f,T}^0(M3M4NO) < \Delta G_{f,T}^0(M1Oss) \leq \Delta G_{f,T}^0(M2NO)$ Generally speaking, in the present application, the generic chemical formulae, that is to say involving the first, second, third and/or fourth metals M1, M2, M3 and/or M4, do not specify the quantity of atoms of each element present in the compound, in order to lighten the notations and to gain in legibility and in clarity. Hereafter, again with an objective of lightening the notations, the particular examples of ternary and quaternary compounds described hereafter do not specify either the quantity of atoms of each element present in the ternary or quaternary compound; only the particular examples of binary compounds specify the quantity of atoms of each element present in said binary compound.

The insulator layer M1Oss is sub-stoichiometric because, according to the above thermodynamic condition, a part of its oxygen migrates to the second sub-layer M3M4O or M3M4NO through the first sub-layer M2N, leading to the formation of an oxygen gradient in the insulator layer M1Oss, with an oxygen depletion situated on the side of the first electrode. A ternary oxynitride M2NO of the second metal M2 forms in a transitory manner in the first sub-layer, in the course of the migration of oxygen from the insulator layer to the second sub-layer. Furthermore, it is observed experimentally that the part of oxygen trapped in the alloy M3M4O or M3M4NO of the second sub-layer does not return into the insulator. A possible explanation is that the oxygen of the alloy M3M4O or M3M4NO is not in interstitial position as in the stacks of the prior art but forms bonds, which contributes to fixing oxygen in the alloy; and that the thermodynamic equilibrium between the second sub-layer M3M4O or M3M4NO and the insulator layer is furthermore broken by the first sub-layer M2N of the nitride of the second metal M2. Generally speaking:

the standard free enthalpy of formation $\Delta G_{f,T}^0$(M3M4O) of the ternary alloy M3M4O is associated with the following chemical equation, for any y:

the standard free enthalpy of formation $\Delta G_{f,T}^0$ (M3M4NO) of the quaternary alloy M3M4NO is associated with the following chemical equation, for any y:

the standard free enthalpy of formation $\Delta G_{f,T}^0$(M1Oss) of the sub-stoichiometric oxide M1Oss of the first metal M1 is associated with the following chemical equation, for any z:

the standard free enthalpy of formation $\Delta G_{f,T}^0$(M2NO) of any ternary oxynitride M2NO of the second metal M2 is associated with the following chemical equation, for any w:

The OxRAM oxide based resistive random access memory cell according to the first aspect of the invention may also have one or more of the characteristics below, considered individually or according to all technically possible combinations thereof:

According to an embodiment, the OxRAM oxide based resistive random access memory cell further comprises a titanium reservoir layer Ti, intercalated between the insulator layer and the first sub-layer M2N of the nitride of the second metal M2. The titanium reservoir layer Ti, in contact with the insulator layer, makes it possible to store or to release oxygen during the operating cycles of the memory.

According to an embodiment, the fourth metal M4 has an oxygen solubility less than the oxygen solubility of the third metal M3. More specifically, the fourth metal M4 has an oxygen solubility less than the oxygen solubility of the third metal M3. The oxygen solubility of a metal designates the proportion of oxygen being that can be stored in the metal in unbound interstitial form (that is to say without M-O bonds; proportion designates for example the average number of atoms of oxygen per atom of metal). Thus, the atomic percentage of the fourth metal M4 in the alloy M3M4O or M3M4NO makes it possible to control the oxygen solubility of the third metal M3 and to avoid the total reduction of the oxygen of the insulator layer. Indeed, the greater the atomic percentage of the fourth metal M4 in the mixture M4/M3, the more the oxygen solubility of the third metal M3 decreases. The presence of the fourth metal M4 (Al or Si, for example) reduces the capacity of the third metal M3 (titanium for example) to absorb oxygen in volume, because the fourth metal M4 produces an effect comparable to that which would be obtained if the surface of the third M3 was passivated. Thus, when the alloy M4/M3 is placed in contact (directly or not) with the insulator layer ("active" layer of the memory, for example SiO2, or HfO2, and which necessarily includes oxygen), the presence of the fourth metal M4 makes it possible to avoid a complete oxygen transfer from the insulator layer to the layer including the third metal M3. In the absence of the fourth metal M4, the layer including the third metal M3 could absorb a large part of the oxygen contained in the insulator layer, which would make it lose a part of its insulating nature.

According to an embodiment, the first, second, third and fourth metals M1, M2, M3 and M4 are selected from transition elements of groups 4, 5 and 6 of the periodic table and the elements silicon Si and aluminium Al; the first and second metals M1 and M2 being identical or distinct and the second and third metals M2 and M3 being identical or distinct but the first, second and third metals M1, M2 and M3 being not all identical; and the third and fourth metals M3 and M4 being distinct.

According to an embodiment, the first, second, third and fourth metals M1, M2, M3 and M4 are selected from the elements hafnium Hf, zirconium Zr, titanium Ti, tantalum Ta, niobium Nb, vanadium V, tungsten W, molybdenum Mo, silicon Si and aluminium Al.

According to an embodiment, the sub-stoichiometric oxide of the first metal M1 is hafnium dioxide $HfO_{z<2}$ or zirconium dioxide $ZrO_{z<2}$ or titanium dioxide $TiO_{z<2}$ or tantalum pentoxide $Ta_2O_{z<5}$ or vanadium dioxide $VO_{z<2}$ or vanadium pentoxide $V_2O_{z<5}$ or tungsten oxide $WO_{z<1}$ or tungsten dioxide $WO_{z<2}$ or tungsten trioxide $WO_{z<3}$ or aluminium oxide $Al_2O_{z<3}$ or silicon dioxide $SiO_{z<2}$.

According to an embodiment, the nitride of the second metal M2 is titanium nitride TiN or tantalum nitride TaN or zirconium nitride ZrN or hafnium nitride HfN or tungsten nitride WN or vanadium nitride VN or titanium carbonitride TiCN or tantalum carbonitride TaCN or molybdenum carbonitride MoCN or tungsten carbonitride WCN.

According to an embodiment, the ternary alloy M3M4O is a ternary alloy of:
  titanium Ti, aluminium Al and oxygen O, or
  titanium Ti, silicon Si and oxygen O, or
  zirconium Zr, aluminium Al and oxygen O, or
  zirconium Zr, silicon Si and oxygen O, or
  hafnium Hf, aluminium Al and oxygen O, or
  hafnium Hf, silicon Si and oxygen O;
and the quaternary alloy M3M4NO is a quaternary alloy of:

titanium Ti, aluminium Al, nitrogen N and oxygen O, or titanium Ti, silicon Si, nitrogen N and oxygen O, or zirconium Zr, aluminium Al, nitrogen N and oxygen O, or zirconium Zr, silicon Si, nitrogen N and oxygen O, or hafnium Hf, aluminium Al, nitrogen N and oxygen O, or hafnium Hf, silicon Si, nitrogen N oxygen O.

According to an embodiment, the second sub-layer of ternary alloy M3M4O or quaternary alloy M3M4NO comprises a proportion of the third metal M3 of (1-x) and a proportion of the fourth metal M4 of x, where x belongs to the interval [1%; 60%], in an embodiment [5%; 50%]; and in an embodiment [10%; 40%]. Thus, the quantity of the fourth metal M4 in the second sub-layer drives the residual and gradient of oxygen in the insulator, while maintaining a sufficiently low part of oxygen in the alloy M3M4O or M3M4NO so that it conserves its conduction properties.

According to an embodiment, x is equal to 30%.

According to an embodiment, the layer M1Oss of sub-stoichiometric oxide of the first metal has a thickness comprised in the interval [1 nm; 15 nm] and, in an embodiment, 10 nm.

According to an embodiment, the first sub-layer M2N of nitride of the second metal has a thickness comprised in the interval [2 nm; 20 nm] and, in an embodiment, 5 nm.

According to an embodiment, the second sub-layer of ternary alloy M3M4O or quaternary alloy M3M4NO has a thickness comprised in the interval [1 nm; 50 nm] and, in an embodiment, 20 nm. The thickness of the second sub-layer contributes to determining the quantity of the fourth metal M4 and thus to driving the residual and gradient of oxygen in the insulator, while maintaining a sufficiently low part of oxygen in the alloy M3M4O or M3M4NO so that it conserves its conduction properties.

A second aspect of the invention relates to a method for manufacturing an OxRAM oxide based resistive random access memory cell according to the first aspect of the invention, comprising the following steps, in this order:
a) depositing a first electrode;
b) depositing a layer M1O of a stoichiometric oxide of a first metal M1;
c) depositing a layer M2N of a nitride of a second metal M2;
d) depositing a layer M3M4 of a binary alloy of a third metal M3 and a fourth metal M4, or M3M4N of a ternary alloy of the third metal M3, the fourth metal M4 and nitrogen N;
e) depositing a second electrode;

the first, second, third and fourth metals M1, M2, M3 and M4 being selected in such a way that the standard free enthalpy of formation of any ternary alloy M3M4O of the third and fourth metals M3, M4 and oxygen O, noted $\Delta G_{f,T}^0(M3M4O)$, or of any quaternary alloy M3M4NO of the third and fourth metals M3, M4, nitrogen N and oxygen O, noted $\Delta G_{f,T}^0(M3M4NO)$, is strictly less than the standard free enthalpy of formation of any sub-stoichiometric oxide M1Oss of the first metal M1, noted $\Delta G_{f,T}^0(M1Oss)$, itself less than or equal to the standard free enthalpy of formation of any ternary oxynitride M2NO of the second metal M2, noted $\Delta G_{f,T}^0(M2NO)$:

$$\Delta G_{f,T}^0(M3M4O) < \Delta G_{f,T}^0(M1Oss) < \Delta G_{f,T}^0(M2NO)$$

$$\text{or } \Delta G_{f,T}^0(M3M4NO) < \Delta G_{f,T}^0(M1Oss) < \Delta G_{f,T}^0(M2NO)$$

Within the scope of the present application, "M1Oss" designates the sub-stoichiometric oxide of the first metal M1 and "M1O" the stoichiometric oxide of the first metal M1. "Stoichiometric oxide" is taken to mean a stable oxide, that is to say which taken individually exists at equilibrium. In contrast, "sub-stoichiometric oxide" is taken to mean an unstable oxide, that is to say that taken individually does not exist at equilibrium, and can only exist within a thermodynamic equilibrium established with other compounds.

According to the above thermodynamic condition, a part of the oxygen of the layer M1O of stoichiometric oxide of the first metal M1 migrates spontaneously to the layer of alloy M3M4 or M3M4N through the layer M2N of nitride of the second metal M2. The layer M1O of oxide of the first metal M1 becomes sub-stoichiometric M1Oss and the layer of alloy M3M4 or M3M4N becomes a layer of alloy M3M4O or M3M4NO. The initial stack evolves spontaneously towards its thermodynamic equilibrium and gives the OxRAM oxide based resistive random access memory cell according to the first aspect of the invention. The thermodynamic reaction can be initiated at ambient temperature or potentially under thermal assistance. The establishment of thermodynamic equilibrium takes place typically in a quasi-immediate manner, in a time of the order of a second or less than a second, or at the most within the manufacturing time of a microelectronic device comprising the memory cell according to the invention, that is to say typically in a time of the order of the hour, for example two hours. The integration of a memory cell according to the invention in a copper line of a microelectronic device imposes on it typically a thermal budget of 400° C. for several hours. The maximum temperature, not to exceed, is typically defined by the degradation of the copper or silicide lines in the sources/drains of the transistors.

The manufacturing method according to the second aspect of the invention may also have one or more of the characteristics below, considered individually or according to all technically possible combinations thereof:

According to an embodiment, the manufacturing method comprises, between steps b) and c), a step b') according to which a titanium reservoir layer Ti is deposited on the layer M1O of stoichiometric oxide of the first metal M1.

According to an embodiment, the fourth metal M4 has an oxygen solubility less than the oxygen solubility of the third metal M3. The fourth metal M4 may further have a substantially zero oxygen solubility, for example less than 3%, or even less than 1%, at room temperature (20 degrees Celsius).

According to an embodiment, the first, second, third and fourth metals M1, M2, M3 and M4 are selected from transition elements of groups 4, 5 and 6 of the periodic table and the elements silicon Si and aluminium Al; the first and second metals M1 and M2 being identical or distinct and the second and third metals M2 and M3 being identical or distinct but the first, second and third metals M1, M2 and M3 not all being identical; and the third and fourth metals M3 and M4 being distinct.

According to an embodiment, the first, second, third and fourth metals M1, M2, M3 and M4 are selected from the elements hafnium Hf, zirconium Zr, titanium Ti, tantalum Ta, niobium Nb, vanadium V, tungsten W, molybdenum Mo, silicon Si and aluminium Al.

According to an embodiment, the stoichiometric oxide of the first metal M1 is hafnium dioxide $HfO_2$ or zirconium dioxide $ZrO_2$ or titanium dioxide $TiO_2$ or tantalum pentoxide $Ta_2O_5$ or vanadium dioxide $VO_2$ or vanadium pentoxide $V_2O_5$ or tungsten oxide $WO_1$ or tungsten dioxide $WO_2$ or tungsten trioxide $WO_3$ or aluminium oxide $Al_2O_3$ or silicon dioxide $SiO_2$.

According to an embodiment, the nitride of the second metal M2 is titanium nitride TiN or tantalum nitride TaN or zirconium nitride ZrN or hafnium nitride HfN or tungsten nitride WN or vanadium nitride VN or titanium carbonitride TiCN or tantalum carbonitride TaCN or molybdenum carbonitride MoCN or tungsten carbonitride WCN.

According to an embodiment, the binary alloy M3M4 is a binary alloy of:
titanium Ti and aluminium Al, or
titanium Ti and silicon Si, or
zirconium Zr, aluminium Al, or
zirconium Zr, silicon Si, or
hafnium Hf, aluminium Al, or
hafnium Hf, silicon Si;
and the ternary alloy M3M4N is a ternary alloy of:
titanium Ti, aluminium Al, and nitrogen N, or
titanium Ti, silicon Si, and nitrogen N, or
zirconium Zr, aluminium Al, and nitrogen N, or
zirconium Zr, silicon Si, and nitrogen N, or
hafnium Hf, aluminium Al, and nitrogen N, or
hafnium Hf, silicon Si, and nitrogen N.

According to an embodiment, the layer of binary alloy M3M4 or ternary alloy M3M4N comprises a proportion of the third metal M3 of (1-x) and a proportion of the fourth metal M4 of x, where x belongs to the interval [1%; 60%], in an embodiment, [5%; 50%], and in another embodiment [10%; 40%].

According to an embodiment, x is equal to 30%.

According to an embodiment, the layer M1O of stoichiometric oxide of the first metal has a thickness comprised in the interval [1 nm; 15 nm] and, in an embodiment, 10 nm.

According to an embodiment, the layer M2N of nitride of the second metal has a thickness comprised in the interval [2 nm; 20 nm] and, in an embodiment, 5 nm.

According to an embodiment, the layer of ternary alloy M3M4O or quaternary alloy M3M4NO has a thickness comprised in the interval [1 nm; 50 nm] and, in an embodiment, 20 nm.

BRIEF DESCRIPTION OF THE FIGURES

Other characteristics and benefits of the invention will become clear from the description that is given thereof below, for indicative purposes and in no way limiting, with reference to the appended figures, among which:

FIG. 1b schematically shows the OxRAM oxide based resistive random access memory cell out of thermodynamic equilibrium, obtained in a transitory manner immediately after the different deposition steps of the method of FIG. 1a.

FIG. 2b schematically shows the OxRAM oxide based resistive random access memory cell out of thermodynamic equilibrium, obtained in a transitory manner immediately after the different deposition steps of the method of FIG. 2a.

FIG. 3b schematically shows the OxRAM oxide based resistive random access memory cell out of thermodynamic equilibrium, obtained in a transitory manner immediately after the different deposition steps of the method of FIG. 3a.

For greater clarity, identical or similar elements are marked by identical reference signs in all of the figures.

DETAILED DESCRIPTION

Figure 1A:
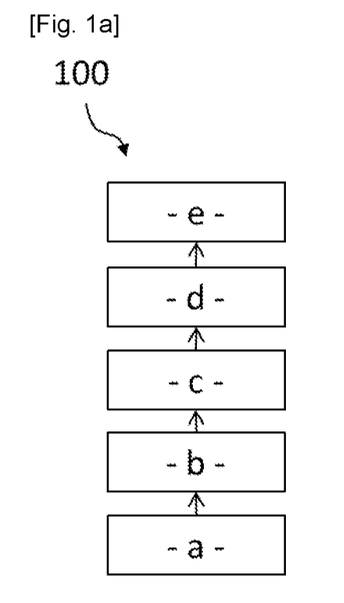
FIG. 1a schematically shows a diagram of the steps of a first method for manufacturing an OxRAM oxide based resistive random access memory cell according to an aspect of the invention.
Figure 1B:
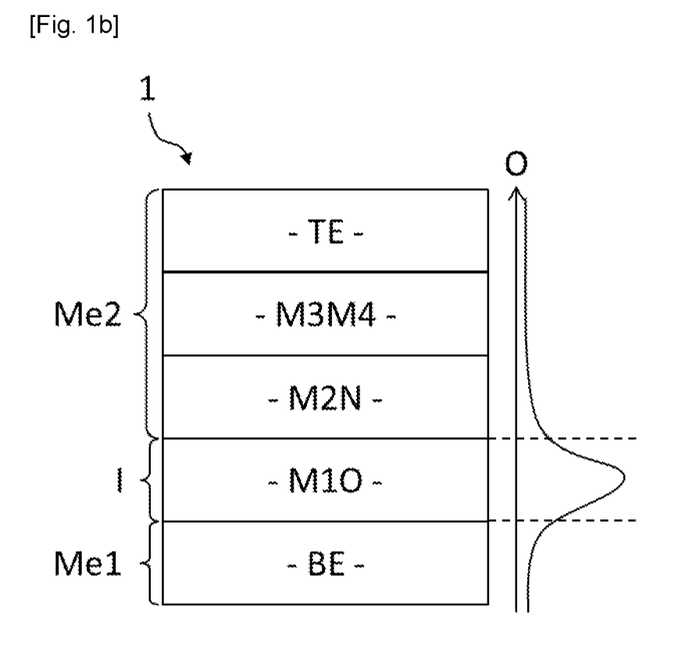
Figure 1C:
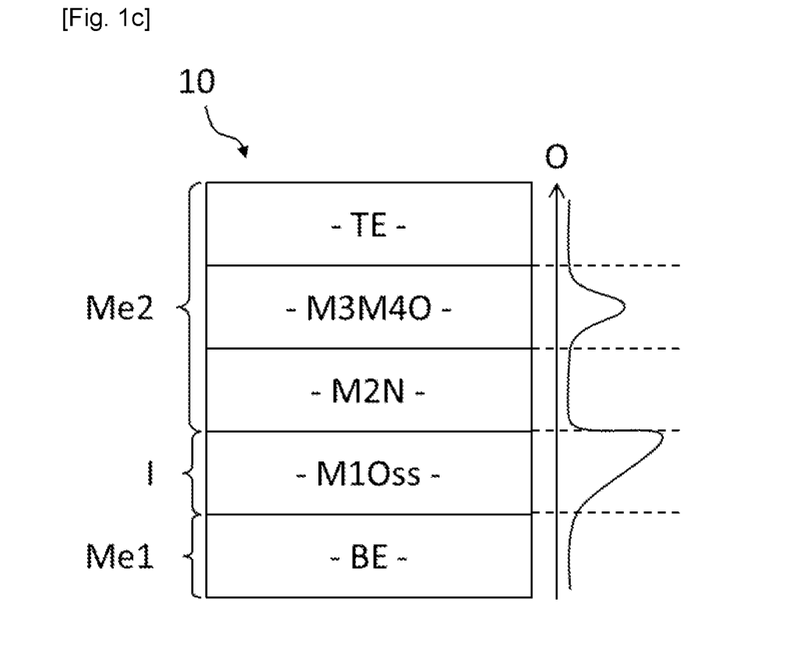
FIG. 1c schematically shows the OxRAM oxide based resistive random access memory cell of FIG. 1b having reached its thermodynamic equilibrium.

FIG. 1a schematically shows a diagram of the steps of a first method for manufacturing 100 an OxRAM oxide based resistive random access memory cell 10 according to a first embodiment of the invention. FIG. 1b schematically shows the OxRAM oxide based resistive random access memory cell 1 out of thermodynamic equilibrium, obtained in a transitory manner immediately after the different deposition steps of the method 100 of FIG. 1a. FIG. 1c schematically shows the OxRAM oxide based resistive random access memory cell 10 having reached its thermodynamic equilibrium. FIGS. 1a, 1b and 1c are described jointly.

The first manufacturing method 100 comprises a first step a) according to which a first electrode or lower electrode BE, for example made of titanium nitride TiN or any other metal neutral vis-à-vis oxygen, is typically deposited on a substrate (not represented); then a second step b) according to which a layer M1O of a stoichiometric oxide of a first metal M1 is deposited on the first electrode BE; then a third step c) according to which a layer M2N of a nitride of a second metal M2 is deposited on the layer M1O; then a fourth step d) according to which a layer M3M4 of a binary alloy of a third metal M3 and a fourth metal M4 is deposited on the layer M2N; then a fifth step e) according to which a second electrode or upper electrode TE, for example made of titanium nitride TiN or any other metal neutral vis-à-vis oxygen, is deposited on the layer M3M4.

The first electrode BE forms a first metal layer Me1; the layer M1O of stoichiometric oxide of the first metal M1 forms an insulator layer I; and the layer M2N of nitride of the second metal M2, the layer M3M4 of binary alloy of the third and fourth metals M3, M4 and the second electrode TE form a second metal layer Me2.

The first, second, third and fourth metals M1, M2, M3 and M4 are such that the standard free enthalpy of formation of any ternary alloy M3M4O of the third and fourth metals M3, M4 and oxygen O, noted $\Delta G_{f,T}^{0}$ (M3M4O), is strictly less than the standard free enthalpy of formation of any sub-stoichiometric oxide M1Oss of the first metal M1, noted $\Delta G_{f,T}^{0}$(M1Oss), itself less than or equal to the standard free enthalpy of formation of any ternary oxynitride M2NO of the second metal M2, noted $\Delta G_{f,T}^{0}$(M2NO):

$$\Delta G_{f,T}^{0}(M3M4O) < \Delta G_{f,T}^{0}(M1Oss) \leq \Delta G_{f,T}^{0}(M2NO)$$

Thus, the stack 1 represented in FIG. 1b evolves spontaneously, at ambient temperature or with thermal assistance, to the stack 10 represented in FIG. 1c: the layer M1O of stoichiometric oxide of the first metal M1 becomes a layer M1Oss of sub-stoichiometric oxide of the first metal M1, and the layer M3M4 of binary alloy of the third and fourth metals M3, M4 becomes a layer M3M4O of ternary alloy of the third and fourth metals M3, M4 and oxygen O. FIGS. 1b and 1c show respectively the schematic oxygen profile of the stacks 1 and 10: in the stack 1, oxygen is found essentially in the layer M1O. In the stack 10, an oxygen gradient has formed in the layer M1Oss, with a localised oxygen depletion on the side of the first electrode BE. At the limit, the oxygen gradient is such that the layer M1Oss is broken down into a first sub-layer M1 of the first metal M1 on the side of the first electrode, and a second sub-layer M1O of stoichiometric oxide of the first metal M1. Furthermore, the oxygen having migrated from the layer M1O is henceforth found localised in the layer M3M4O.

Figure 2A:
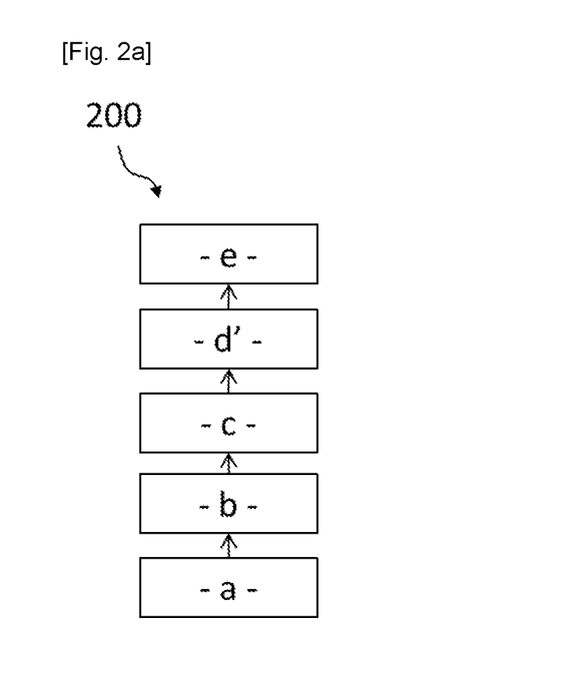
FIG. 2a schematically shows a diagram of the steps of a second method for manufacturing an OxRAM oxide based resistive random access memory cell according to an aspect of the invention.
Figure 2B:
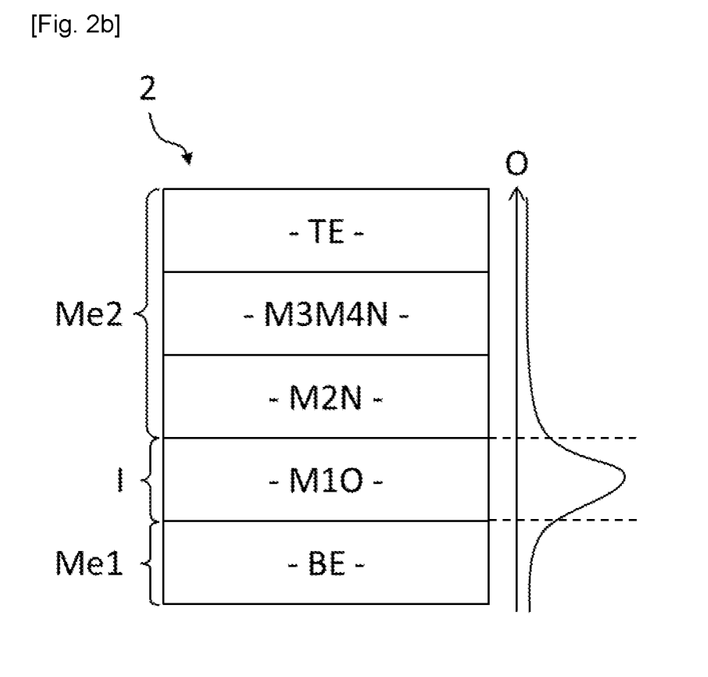
Figure 2C:
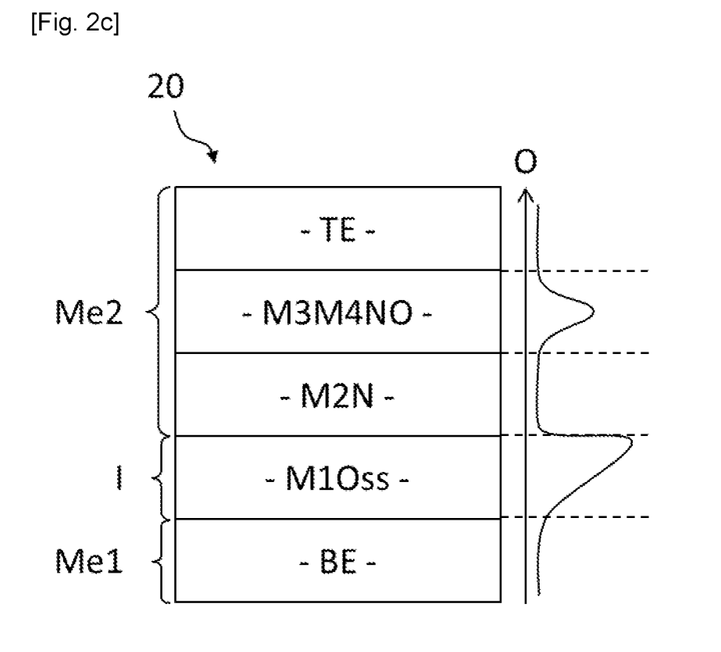
FIG. 2c schematically shows the OxRAM oxide based resistive random access memory cell of FIG. 2b having reached its thermodynamic equilibrium.

FIG. 2a schematically shows a diagram of the steps of a second method for manufacturing 200 an OxRAM oxide based resistive random access memory cell 20 according to a second embodiment of the invention. FIG. 2b schematically shows the OxRAM oxide based resistive random access memory cell 2 out of thermodynamic equilibrium, obtained in a transitory manner immediately after the different deposition steps of the method of FIG. 2a. FIG. 2c schematically shows the OxRAM oxide based resistive random access memory cell 20 having reached its thermodynamic equilibrium. FIGS. 2a, 2b and 2c are described jointly.

The second manufacturing method 200 is identical to the first manufacturing method 100, with the exception of its fourth step d'), according to which a layer M3M4N of a ternary alloy of the third and fourth metals M3, M4 and nitrogen N, is deposited on the layer M2N. The first, second, third and fourth metals M1, M2, M3, M4 are such that the standard free enthalpy of formation of any quaternary alloy M3M4NO of the third and fourth metals M3, M4, nitrogen N and oxygen O, noted $\Delta G_{f,T}^0$(M3M4NO), is strictly less than the standard free enthalpy of formation of any sub-stoichiometric oxide M1Oss of the first metal M1, noted $\Delta G_{f,T}^0$(M1Oss), itself less than or equal to the standard free enthalpy of formation of any ternary oxynitride M2NO of the second metal M2, noted $\Delta G_{f,T}^0$(M2NO):

$$\Delta G_{f,T}^0(M3M4NO) < \Delta G_{f,T}^0(M1Oss) \leq \Delta G_{f,T}^0(M2NO)$$

The stack 2 represented in FIG. 2b evolves spontaneously, at ambient temperature or with thermal assistance, to the stack 20 represented in FIG. 2c, in a manner analogous to the evolution described previously from the stack 1 of FIG. 1b to the stack 10 of FIG. 1c, the layer M3M4N of ternary alloy of the third and fourth metals M3, M4 and nitrogen N becoming a layer M3M4NO of quaternary alloy of the third and fourth metals M3, M4, nitrogen N and oxygen O. FIGS. 2b and 2c show respectively the schematic oxygen profile of the stacks 2 and 20, which is analogous to that of the stacks 1 and 10 of FIGS. 1b and 1c.

Figure 3A:
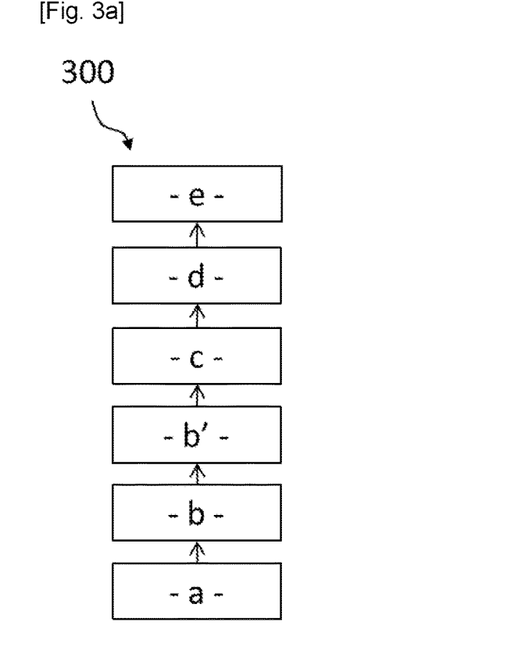
FIG. 3a schematically shows a diagram of the steps of a third method for manufacturing an OxRAM oxide based resistive random access memory cell according to an aspect of the invention.
Figure 3B:
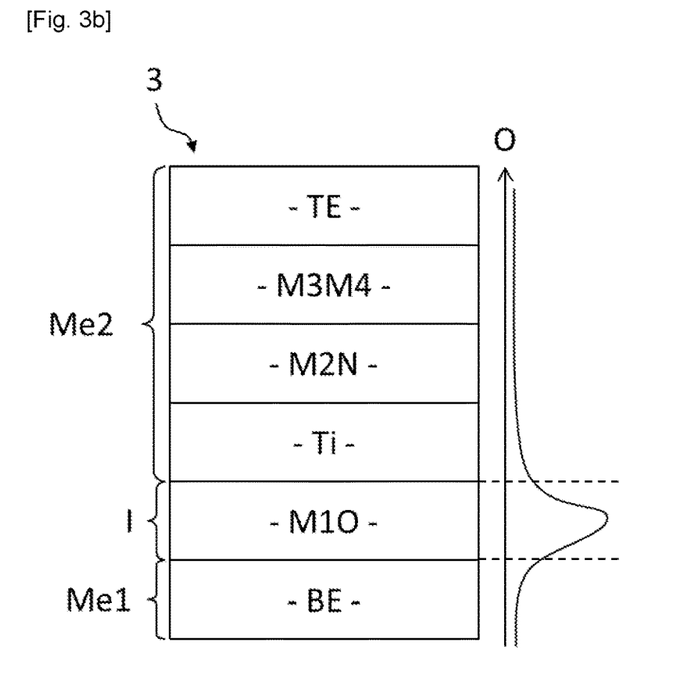
Figure 3C:
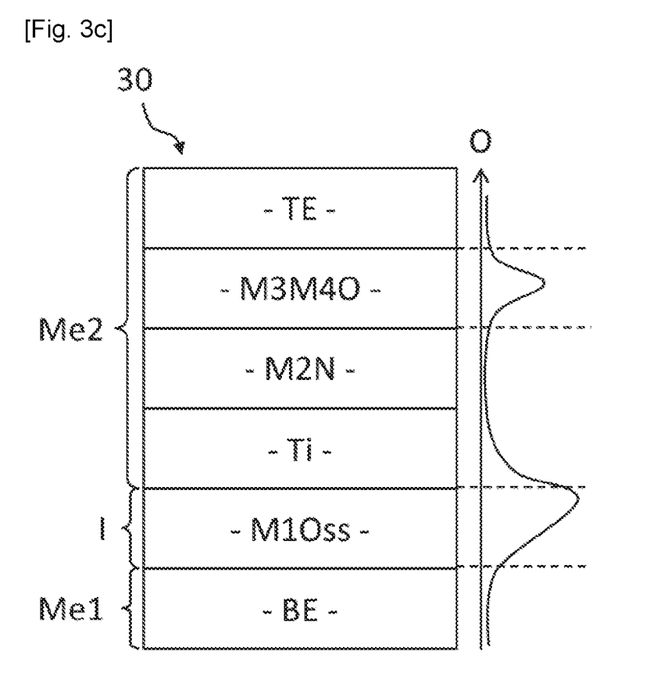
FIG. 3c schematically shows the OxRAM oxide based resistive random access memory cell of FIG. 3b having reached its thermodynamic equilibrium.

FIG. 3a schematically shows a diagram of the steps of a third method for manufacturing 300 an OxRAM oxide based resistive random access memory cell 30 according to a third embodiment of the invention. FIG. 3b schematically shows the OxRAM oxide based resistive random access memory cell 3 out of thermodynamic equilibrium, obtained in a transitory manner immediately after the different deposition steps of the method 300 of FIG. 3a. FIG. 3c schematically shows the OxRAM oxide based resistive random access memory cell 30 having reached its thermodynamic equilibrium. FIGS. 3a, 3b and 3c are described jointly.

The third manufacturing method 300 is identical to the first manufacturing method 100, with the exception of an additional step b') intercalated between steps b) and c), and according to which a titanium reservoir layer Ti is deposited on the insulator layer M1O of stoichiometric oxide of the first metal M1. The layer M2N of the nitride of the second metal is then no longer deposited on the layer M1O but on the titanium reservoir layer Ti. In the same way as for the first manufacturing method, the first, second, third and fourth metals M1, M2, M3, M4 are such that the standard free enthalpy of formation of any ternary alloy M3M4O of the third and fourth metals M3, M4 and oxygen O, noted $\Delta G_{f,T}^0$(M3M4O), is strictly less than the standard free enthalpy of formation of any sub-stoichiometric oxide M1Oss of the first metal M1, noted $\Delta G_{f,T}^0$(M1Oss), itself less than or equal to the standard free enthalpy of formation of any ternary oxynitride M2NO of the second metal M2, noted $\Delta G_{f,T}^0$(M2NO):

$$\Delta G_{f,T}^0(M3M4O) < \Delta G_{f,T}^0(M1Oss) < \Delta G_{f,T}^0(M2NO)$$

The stack 3 represented in FIG. 3b evolves spontaneously, at ambient temperature or with thermal assistance, to the stack 30 represented in FIG. 3c, in an analogous manner to the evolution described previously from the stack 1 of FIG. 1b to the stack 10 of FIG. 1c. FIGS. 3b and 3c show respectively the schematic oxygen profile of the stacks 3 and 30, which is analogous to that of the stacks 1 and 10 of FIGS. 1b and 1c.

The second and third manufacturing methods 200, 300 each represent an alternative of the first manufacturing method 100: layer M3M4N instead of M3M4 for the second method 200; additional titanium Ti reservoir layer for the third method 300. These two alternatives are compatible with each other: a manufacturing method comprising both step b') of deposition of a titanium reservoir layer Ti on the insulator layer M1O, and step d') of deposition of a layer M3M4N on the layer M2N does not go beyond the scope of the invention. The stack obtained immediately at the end of this manufacturing method comprises the second electrode TE, on the layer M3M4N, on the layer M2N, on the Ti reservoir layer, on the layer M1O, on the first electrode BE. This stack evolves spontaneously, at ambient temperature or with thermal assistance, to a stack in which the layer M3M4N becomes the layer M3M4NO and the layer M1O becomes the layer M1Oss, in an analogous manner to the evolutions described previously.

Several particular exemplary embodiments will now be described. According to a first example, the first metal M1 is hafnium Hf, the second and third metals M2, M3 are titanium Ti and the fourth metal M4 is aluminium Al. The layer M1O is a layer of stoichiometric hafnium dioxide $HfO_2$; the layer M1Oss is a layer of sub-stoichiometric hafnium dioxide $HfO_{z<2}$. The layer M2N is a layer of titanium nitride TiN. The layer M3M4 is a layer of titanium-aluminium TiAl; the layer M3M4O is a layer TiAlO of alloy of titanium, aluminium and oxygen.

According to a second example, the first and second metals M1, M2 are hafnium Hf, the third metal is titanium Ti and the fourth metal is aluminium Al. The layer M1O is a layer of stoichiometric hafnium dioxide $HfO_2$; the layer M1Oss is a layer of sub-stoichiometric hafnium dioxide $HfO_{z<2}$. The layer M2N is a layer of hafnium nitride HfN. The layer M3M4 is a layer of titanium-aluminium TiAl; the layer M3M4O is a layer TiAlO of alloy of titanium, aluminium and oxygen.

According to a third example, the first and second metals M1, M2 are vanadium V, the third metal is hafnium Hf and the fourth metal is silicon Si. The layer M1O is a layer of stoichiometric vanadium pentoxide $V_2O_5$; the layer M1Oss is a layer of sub-stoichiometric vanadium pentoxide $V_2O_{z<5}$. The layer M2N is a layer of vanadium nitride VN. The layer M3M4 is a layer of hafnium-silicon HfSi; the layer M3M4O is a layer HfSiO of alloy of hafnium, silicon and oxygen.

According to a fourth example, the first metal M1 is hafnium Hf, the second metal M2 is zirconium Zr, the third metal is titanium Ti and the fourth metal is aluminium Al. The layer M1O is a layer of stoichiometric hafnium dioxide $HfO_2$; the layer M1Oss is a layer of sub-stoichiometric hafnium dioxide $HfO_{z<2}$. The layer M2N is a layer of zirconium nitride ZrN. The layer M3M4 is a layer of titanium-aluminium TiAl; the layer M3M4O is a layer TiAlO of alloy of titanium, aluminium and oxygen.

More generally, the fourth metal M4 is selected to have an oxygen solubility less than the oxygen solubility of the third metal M3. The layer of binary alloy M3M4 or ternary alloy M3M4N comprises a proportion of the third metal M3 of (1-x) and a proportion of the fourth metal M4 of x, where x belongs to the interval [1%; 60%], in an embodiment [5%; 50%], and in another embodiment [10%; 40%]. For example, x is equal to 30%.

The first, second, third and fourth metals M1, M2, M3 and M4 are selected from transition elements of groups 4, 5 and 6 of the periodic table and the elements silicon Si and aluminium Al; the first and second metals M1 and M2 being identical or distinct and the second and third metals M2 and M3 being identical or distinct but the first, second and third metals M1 M2 and M3 not all being identical; and the third and fourth metals M3 and M4 being distinct. The first, second, third and fourth metals M1, M2, M3 and M4 are for example selected from the elements hafnium Hf, zirconium Zr, titanium Ti, tantalum Ta, niobium Nb, vanadium V, tungsten W, molybdenum Mo, silicon Si and aluminium Al.

The stoichiometric oxide of the first metal M1 is for example hafnium dioxide $HfO_2$ or zirconium dioxide $ZrO_2$ or titanium dioxide $TiO_2$ or tantalum pentoxide $Ta_2O_5$ or vanadium dioxide $VO_2$ or vanadium pentoxide $V_2O_5$ or tungsten oxide $WO_1$ or tungsten dioxide $WO_2$ or tungsten trioxide $WO_3$ or aluminium oxide $Al_2O_3$ or silicon dioxide $SiO_2$. The sub-stoichiometric oxide of the first metal M1 is thus for example hafnium dioxide $HfO_{z<2}$ or zirconium dioxide $ZrO_{z<2}$ or titanium dioxide $TiO_{z<2}$ or tantalum pentoxide $Ta_2O_{z<5}$ or vanadium dioxide $VO_{z<2}$ or vanadium pentoxide $V_2O_{z<5}$ or tungsten oxide $WO_{z<1}$ or tungsten dioxide $WO_{z<2}$ or tungsten trioxide $WO_{z<3}$ or aluminium oxide $Al_2O_{z<3}$ or silicon dioxide $SiO_{z<2}$.

The nitride of the second metal M2 is titanium nitride TiN or tantalum nitride TaN or zirconium nitride ZrN or hafnium nitride HfN or tungsten nitride WN or vanadium nitride VN or titanium carbonitride TiCN or tantalum carbonitride TaCN or molybdenum carbonitride MoCN or tungsten carbonitride WCN.

According to the first embodiment, the binary alloy M3M4 is for example a binary alloy of:
titanium Ti and aluminium Al, or
titanium Ti and silicon Si, or
zirconium Zr and aluminium Al, or
zirconium Zr and silicon Si.
hafnium Hf and aluminium Al, or
hafnium Hf and silicon Si.

The ternary alloy M3M4O is thus for example a ternary alloy of:
titanium Ti, aluminium Al and oxygen O, or
titanium Ti, silicon Si and oxygen O, or
zirconium Zr, aluminium Al and oxygen O, or
zirconium Zr, silicon Si and oxygen O, or
hafnium Hf, aluminium Al and oxygen O, or
hafnium Hf, silicon Si and oxygen O.

According to the second embodiment, the ternary alloy M3M4N is for example a ternary alloy of:
titanium Ti, aluminium Al, and nitrogen N, or
titanium Ti, silicon Si, and nitrogen N, or
zirconium Zr, aluminium Al, and nitrogen N, or
zirconium Zr, silicon Si, and nitrogen N, or
hafnium Hf, aluminium Al, and nitrogen N, or
hafnium Hf, silicon Si, and nitrogen N.

The quaternary alloy M3M4NO is thus for example a quaternary alloy of:
titanium Ti, aluminium Al, nitrogen N and oxygen O, or
titanium Ti, silicon Si, nitrogen N and oxygen O, or
zirconium Zr, aluminium Al, nitrogen N and oxygen O, or
zirconium Zr, silicon Si, nitrogen N and oxygen O, or
hafnium Hf, aluminium Al, nitrogen N and oxygen O, or
hafnium Hf, silicon Si, nitrogen N oxygen O.

According to any of the embodiments:
the layer M1O of stoichiometric oxide of the first metal and the layer M1Oss of sub-stoichiometric oxide of the first metal are of thickness comprised in the interval [1 nm; 15 nm] and in an embodiment 10 nm; and
the layer M2N of nitride of the second metal has a thickness comprised in the interval [2 nm; 20 nm] and in an embodiment 5 nm;
the layer of binary alloy M3M4 or ternary alloy M3M4N, and the layer of ternary alloy M3M4O or quaternary alloy M3M4NO, are of thickness comprised in the interval [1 nm; 50 nm] and in an embodiment 20 nm.

Naturally, the invention is not limited to the embodiments described with reference to the figures and alternatives could be envisaged without going beyond the scope of the invention.

The invention claimed is:

1. An OxRAM oxide based resistive random access memory cell comprising an insulator layer arranged between a first metal layer and a second metal layer, wherein:
the first metal layer is a first electrode;
the insulator layer is a layer M1Oss of a sub-stoichiometric oxide of a first metal M1;
the second metal layer comprises, in this order from the insulator layer:
a first sub-layer M2N of a nitride of a second metal M2;
a second sub-layer M3M4O of a ternary alloy of a third metal M3, a fourth metal M4 and oxygen O, or M3M4NO of a quaternary alloy of the third metal M3, the fourth metal M4, nitrogen N and oxygen O;
a second electrode;
and wherein the first, second, third and fourth metals M1, M2, M3 and M4 are such that the standard free enthalpy of formation of the ternary alloy M3M4O, noted $\Delta G_{f,T}^0$ (M3M4O), or of the quaternary alloy M3M4NO, noted $\Delta G_{f,T}^0$ (M3M4NO), is strictly less than the standard free enthalpy of formation of the sub-stoichiometric oxide M1Oss of the first metal M1, noted $\Delta G_{f,T}^0$ (M1Oss), itself less than or equal to the standard free enthalpy of formation of any ternary oxynitride M2NO of the second metal M2, noted $\Delta G_{f,T}^0$ (M2NO):

$$\Delta G_{f,T}^0(M3M4O) < \Delta G_{f,T}^0(M1Oss) \leq \Delta G_{f,T}^0(M2NO)$$

$$\text{or } \Delta G_{f,T}^0(M3M4NO) < \Delta G_{f,T}^0(M1Oss) \leq \Delta G_{f,T}^0(M2NO).$$

2. The OxRAM oxide based resistive random access memory cell according to claim 1, further comprising a titanium reservoir layer Ti, intercalated between the insulator layer and the first sub-layer M2N of the nitride of the second metal M2 of the second metal layer.

3. The OxRAM oxide based resistive random access memory cell according to claim 1, wherein the fourth metal M4 has an oxygen solubility less than the oxygen solubility of the third metal M3.

4. The OxRAM oxide based resistive random access memory cell according to claim 1, wherein the first, second, third and fourth metals M1, M2, M3 and M4 are selected from transition elements of groups 4, 5 and 6 of the periodic table and the elements silicon Si and aluminium Al; the first and second metals M1 and M2 being identical or distinct and the second and third metals M2 and M3 being identical or distinct but the first, second and third metals M1, M2 and M3 being not all identical; and the third and fourth metals M3 and M4 being distinct.

5. The OxRAM oxide based resistive random access memory cell according to claim 4, wherein the first, second, third and fourth metals M1, M2, M3 and M4 are selected from the elements hafnium Hf, zirconium Zr, titanium Ti, tantalum Ta, niobium Nb, vanadium V, tungsten W, molybdenum Mo, silicon Si and aluminium Al.

6. The OxRAM oxide based resistive random access memory cell according to claim 1, wherein the sub-stoichiometric oxide of the first metal M1 is hafnium dioxide $HfO_{z<2}$ or zirconium dioxide $ZrO_{z<2}$ or titanium dioxide $TiO_{z<2}$ or tantalum pentoxide $Ta2O_{z<5}$ or vanadium dioxide $VO_{z<2}$ or vanadium pentoxide $V2O_{z<5}$ or tungsten oxide $WO_{z<1}$ or tungsten dioxide $WO_{z<2}$ or tungsten trioxide $WO_{z<3}$ or aluminium oxide $Al_2O_{z<3}$ or silicon dioxide $SiO_{z<2}$.

7. The OxRAM oxide based resistive random access memory cell according to claim 1, wherein the nitride of the second metal M2 is titanium nitride TiN or tantalum nitride TaN or zirconium nitride ZrN or hafnium nitride HfN or tungsten nitride WN or vanadium nitride VN or titanium carbonitride TiCN or tantalum carbonitride TaCN or molybdenum carbonitride MoCN or tungsten carbonitride WCN.

8. The OxRAM oxide based resistive random access memory cell according to claim 1, wherein the ternary alloy M3M4O is a ternary alloy of:
  titanium Ti, aluminium Al and oxygen O, or
  titanium Ti, silicon Si and oxygen O, or
  zirconium Zr, aluminium Al and oxygen O, or
  zirconium Zr, silicon Si and oxygen O, or
  hafnium Hf, aluminium Al and oxygen O, or
  hafnium Hf, silicon Si and oxygen O; and wherein the quaternary alloy M3M4NO is a quaternary alloy of:
  titanium Ti, aluminium Al, nitrogen N and oxygen O, or
  titanium Ti, silicon Si, nitrogen N and oxygen O, or
  zirconium Zr, aluminium Al, nitrogen N and oxygen O, or
  zirconium Zr, silicon Si, nitrogen N and oxygen O, or
  hafnium Hf, aluminium Al, nitrogen N and oxygen O, or
  hafnium Hf, silicon Si, nitrogen N, oxygen O.

9. The OxRAM oxide based resistive random access memory cell according to claim 1, wherein the second sub-layer of ternary alloy M3M4O or quaternary alloy M3M4NO comprises a proportion of the third metal M3 of (1-x) and a proportion of the fourth metal M4 of x, where x is from 1% to 60%.

10. The OxRAM oxide based resistive random access memory cell according to claim 9, wherein x is from 5% to 50%.

11. The OxRAM oxide based resistive random access memory cell according to claim 10, wherein x is from 10% to 40%.

12. The OxRAM oxide based resistive random access memory cell according to claim 11, wherein x is equal to 30%.

13. The OxRAM oxide based resistive random access memory cell according to claim 1, wherein the layer M1Oss of sub-stoichiometric oxide of the first metal has a thickness from 1 nm to 15 nm.

14. The OxRAM oxide based resistive random access memory cell according to claim 13, wherein the layer M1Oss of sub-stoichiometric oxide of the first metal has a thickness of 10 nm.

15. The OxRAM oxide based resistive random access memory cell according to claim 1, wherein the first sub-layer M2N of nitride of the second metal has a thickness from 2 nm to 20 nm.

16. The OxRAM oxide based resistive random access memory cell according to claim 15, wherein the first sub-layer M2N of nitride of the second metal has a thickness of 5 nm.

17. The OxRAM oxide based resistive random access memory cell according to claim 1, wherein the second sub-layer of ternary alloy M3M4O or quaternary alloy M3M4NO has a thickness from 1 nm to 50 nm.

18. The OxRAM oxide based resistive random access memory cell according to claim 17, wherein the second sub-layer of ternary alloy M3M4O or quaternary alloy M3M4NO has a thickness of 20 nm.

19. A method for manufacturing an OxRAM oxide based resistive random access memory cell according to claim 1, comprising, in this order:
  a) depositing a first electrode;
  b) depositing a layer M1O of a stoichiometric oxide of a first metal M1;
  c) depositing a layer M2N of a nitride of a second metal M2;
  d) depositing a layer M3M4 of a binary alloy of a third metal M3 and a fourth metal M4, or M3M4N of a ternary alloy of the third metal M3, the fourth metal M4 and nitrogen N;
  e) depositing a second electrode;
  the first, second, third and fourth metals M1, M2, M3 and M4 being selected in such a way that the standard free enthalpy of formation of any ternary alloy M3M4O of the third and fourth metals M3, M4 and oxygen O, noted $\Delta G_{f,T}^{0}$ (M3M4O), or of any quaternary alloy M3M4NO of the third and fourth metals M3, M4, nitrogen N and oxygen O, noted $\Delta G_{f,T}^{0}$ (M3M4NO), is strictly less than the standard free enthalpy of formation of any sub-stoichiometric oxide M1Oss of the first metal M1, noted $\Delta G_{f,T}^{0}$ (M1Oss), itself less than or equal to the standard free enthalpy of formation of any ternary oxynitride M2NO of the second metal M2, noted $\Delta G_{f,T}^{0}$ (M2NO):

$$\Delta G_{f,T}^{0}(M3M4O) < \Delta G_{f,T}^{0}(M1Oss) \leq \Delta G_{f,T}^{0}(M2NO)$$

or $\Delta G_{f,T}^{0}(M3M4NO) < \Delta G_{f,T}^{0}(M1Oss) \leq \Delta G_{f,T}^{0}(M2NO)$.

* * * * *